US012772695B2

(12) United States Patent
Wang et al.

(10) Patent No.: US 12,772,695 B2
(45) Date of Patent: Oct. 20, 2026

(54) DISPLAY PANEL AND FABRICATION METHOD THEREOF

(71) Applicants: Chengdu BOE Optoelectronics Technology Co., Ltd., Chengdu (CN); BOE TECHNOLOGY GROUP CO., LTD., Beijing (CN)

(72) Inventors: Qingsong Wang, Beijing (CN); Liqiang Chen, Beijing (CN); Jiafan Shi, Beijing (CN); Zuojia Wang, Beijing (CN); Yang Yang, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 507 days.

(21) Appl. No.: 17/601,133

(22) PCT Filed: Dec. 23, 2020

(86) PCT No.: PCT/CN2020/138624
§ 371 (c)(1),
(2) Date: Oct. 4, 2021

(87) PCT Pub. No.: WO2022/133804
PCT Pub. Date: Jun. 30, 2022

(65) Prior Publication Data

US 2022/0399375 A1 Dec. 15, 2022

(51) Int. Cl.
*H10K 59/82* (2023.01)
*H10D 86/01* (2026.01)
(Continued)

(52) U.S. Cl.
CPC ......... *H10K 59/82* (2023.02); *H10D 86/0212* (2025.01); *H10D 86/411* (2025.01);
(Continued)

(58) Field of Classification Search
None
See application file for complete search history.

(56) References Cited

U.S. PATENT DOCUMENTS 10,700,311 B2 6/2020 Kwon et al.
2016/0329520 A1* 11/2016 Namkung ............ H10K 59/873
(Continued)

FOREIGN PATENT DOCUMENTS

CN 105976718 A 9/2016
CN 108052233 A 5/2018
(Continued)

OTHER PUBLICATIONS

Written Opinion of the International Searching Authority for PCT/CN2020/138624 mailed Sep. 24, 2021.
(Continued)

*Primary Examiner* — Jessica S Manno
*Assistant Examiner* — Christopher A. Schodde
(74) *Attorney, Agent, or Firm* — Perilla Knox & Hildebrandt; Kenneth A. Knox

(57) ABSTRACT

A display panel and a fabrication method thereof are provided. The display panel includes: an array substrate including a display portion and a bending portion connected to a side of the display portion; a functional film layer at a side of the display portion; and a protective layer covering the bending portion. The protective layer and the functional film layer are at the same side of the array substrate. The protective layer includes a first bending portion arranged adjacent to the functional film layer, and a second bending portion connected to a side of the first bending portion away from the functional film layer. A distance between an edge of the second bending portion away from the first bending portion and the functional film layer in a first direction
(Continued)

perpendicular to an interface between the display portion and the bending portion is the largest in the protective layer.

4 Claims, 4 Drawing Sheets

(51) Int. Cl.
*H10D 86/40* (2025.01)
*H10D 86/60* (2025.01)
*H10K 59/80* (2023.01)

(52) U.S. Cl.
CPC ........... *H10D 86/60* (2025.01); *H10K 59/873* (2023.02); *H10K 59/8794* (2023.02)

(56) References Cited

U.S. PATENT DOCUMENTS

| | | | | |
|---|---|---|---|---|
| 2017/0032737 | A1 | 2/2017 | Lee et al. | |
| 2017/0084673 | A1* | 3/2017 | Lee | H10K 50/84 |
| 2017/0371194 | A1* | 12/2017 | Tomioka | G02F 1/133305 |
| 2018/0027651 | A1* | 1/2018 | Lim | H05K 1/144<br>361/749 |
| 2018/0062090 | A1* | 3/2018 | Kim | H10K 50/846 |
| 2018/0097199 | A1* | 4/2018 | Jo | H10K 71/00 |
| 2018/0224688 | A1* | 8/2018 | Chen | H10K 71/00 |
| 2018/0315809 | A1 | 11/2018 | Kim et al. | |
| 2019/0094610 | A1 | 3/2019 | Yukawa et al. | |
| 2019/0165332 | A1* | 5/2019 | Kwon | H10K 59/87 |
| 2019/0280248 | A1 | 9/2019 | Kwon et al. | |
| 2019/0318689 | A1 | 10/2019 | Kim | |
| 2020/0295283 | A1* | 9/2020 | Lee | H10K 50/86 |
| 2020/0328375 | A1* | 10/2020 | Won | H10K 59/8791 |
| 2020/0411795 | A1* | 12/2020 | Kwon | H10K 50/844 |
| 2021/0118336 | A1* | 4/2021 | Jin | H05K 1/028 |
| 2021/0136908 | A1* | 5/2021 | Seo | H05K 1/147 |
| 2021/0183274 | A1* | 6/2021 | Jeon | H05K 1/189 |
| 2022/0181576 | A1* | 6/2022 | Cha | H05K 1/028 |
| 2023/0073412 | A1* | 3/2023 | Lee | B32B 17/06 |

FOREIGN PATENT DOCUMENTS

| | | | |
|---|---|---|---|
| CN | 110335544 | A | 10/2019 |
| CN | 105976718 | B | 11/2019 |
| CN | 110536542 | A | 12/2019 |
| CN | 111509017 | A | 8/2020 |
| CN | 108052233 | B | 3/2021 |
| EP | 3595027 | A1 | 1/2020 |
| JP | 2017006664 | A | 1/2017 |
| JP | 2019060906 | A | 4/2019 |
| KR | 20170137690 | A | 12/2017 |
| KR | 20190060275 | A | 6/2019 |

OTHER PUBLICATIONS

First Office Action for CN Patent Application No. 202080003556X of Mar. 12, 2025.

* cited by examiner

--Prior Art--

--Prior Art--

DISPLAY PANEL AND FABRICATION METHOD THEREOF

CROSS-REFERENCE TO RELATED APPLICATION

The present disclosure is a national phase application under 35 U.S.C. § 371 of International Application No. PCT/CN2020/138624 filed Dec. 23, 2020, the contents of which being incorporated by reference in their entirety herein.

TECHNICAL FIELD

The present disclosure relates to the technical field of display and, in particular, to a display panel and a fabrication method thereof.

BACKGROUND

A flexible array substrate generally includes a display portion, a bonding portion, and a bending portion connected between the display portion and the bonding portion. The display portion is provided with a functional film layer thereon, and the bonding portion needs to be provided with a protective layer thereon to protect the integrated circuit on the bonding portion. In the related art, the protective layer is usually coated on the bending portion, and then a functional film layer is attached to the display portion. In order to prevent the functional film layer from being attached to the protective layer, considering a coating tolerance of the protective layer and a bonding tolerance of the functional film layer, it is necessary to reserve a certain gap between the functional film layer and the protective layer during the design, therefore, the display panel in the related art has a larger frame.

It should be noted that information disclosed in this part are provided only for acquiring a better understanding of the background of the present application and therefore may include information that is not current technology already known to those of ordinary skill in the art.

SUMMARY

According to one aspect of the present disclosure, a display panel is provided. The display panel includes an array substrate, a functional film layer, a protective layer, and a cover plate. The array substrate includes a display portion and a bending portion, and the bending portion is connected to a side of the display portion. The functional film layer is arranged at a side of the display portion and includes at least one of a filter layer and a touch control layer. The protective layer covers on the bending portion, and the protective layer and the functional film layer are located at the same side of the array substrate. The protective layer includes a first bending portion and a second bending portion. The first bending portion is arranged adjacent to the functional film layer, and the second bending portion is connected to a side of the first bending portion away from the functional film layer. The second bending portion includes a second edge away from the first bending portion. A distance between the second edge and the functional film layer in a first direction is largest in the protective layer, and the first direction is perpendicular to an interface between the display portion and the bending portion. A difference between a maximum thickness of the first bending portion and a minimum thickness of the second bending portion is less than or equal to 0.05 mm. The cover plate is located at one side of the functional film layer away from the array substrate.

In an exemplary embodiment of the present disclosure, the maximum thickness of the first bending portion is greater than or equal to 0.13 mm and less than or equal to 0.15 mm, and the minimum thickness of the second bending portion is greater than or equal to 0.08 mm and less than or equal to 0.1 mm.

In an exemplary embodiment of the present disclosure, the array substrate further includes a bonding portion, the bending portion is connected between the display portion and the bonding portion. The display panel further includes a chip, a first bottom film, and a second bottom film. The chip is bonded to the bonding portion, and the chip and the functional film layer is located at the same side of the array substrate. The first bottom film is at a side of the display portion away from the functional film layer. The second bottom film is at a side of the bonding portion away from the chip. The first bending portion includes a first edge connected with the second bending portion. In the first direction, the first edge is between the first bottom film and the second edge, and between the second bottom film and the second edge. A distance between the first edge and the first bottom film in the first direction is less than or equal to a distance between the first edge and the second bottom film in the first direction.

In an exemplary embodiment of the present disclosure, a distance between an edge of the first bottom film facing the first edge and an edge of the second bottom film facing the first edge in the first direction is greater than or equal to 0 mm and less than or equal to 0.2 mm.

In an exemplary embodiment of the present disclosure, the distance between the first edge and the first bottom film in the first direction is greater than or equal to 0.125 mm and less than or equal to 0.225 mm; the distance between the first edge and the second bottom film in the first direction is greater than or equal to 0.125 mm and less than or equal to 0.425 mm In an exemplary embodiment of the present disclosure, an arc length of the first bending portion is greater than or equal to 0.188 mm and less than or equal to 0.235 mm.

In an exemplary embodiment of the present disclosure, an arc length of the second bending portion is greater than or equal to 0.235 mm and less than or equal to 0.285 mm.

In an exemplary embodiment of the present disclosure, the bonding portion is parallel to the display portion; in a second direction, a distance between the second edge and the bonding portion is greater than a distance between the second edge and the display portion, and the second direction is perpendicular to a plane where the display portion is located; and a distance between the bonding portion and the display portion is 0.3-0.7 mm.

In an exemplary embodiment of the present disclosure, the display panel further includes a heat dissipation layer at a side of the first bottom film away from the display portion, and an adhesive layer between the second bottom film and the heat dissipation layer.

In an exemplary embodiment of the present disclosure, a distance between the heat dissipation layer and the first edge in the first direction is smaller than a distance between the adhesive layer and the first edge in the first direction.

In an exemplary embodiment of the present disclosure, a thickness of the first bending portion gradually decreases from an edge close to the functional film layer to a side away from the functional film layer; and a thickness of the second bending portion gradually decreases from an edge close to the first bending portion to an edge away from the first bending portion.

In an exemplary embodiment of the present disclosure, the protective layer further includes a third bending portion connected to a side of the second bending portion away from the first bending portion, and a thickness of the third bending portion gradually increases from an edge close to the second bending portion to an edge away from the second bending portion.

According to one aspect of the present disclosure, a display panel is provided. The display panel includes an array substrate, a functional film layer, a protective layer, and a cover plate. The array substrate includes a display portion and a bending portion, and the bending portion is connected to one side of the display portion. The functional film layer is arranged at a side of the display portion and includes at least one of a filter layer and a touch control layer. The protective layer covers the bending portion, the protective layer, and the functional film layer is located at a same side of the array substrate. The protective layer includes a first bending portion and a second bending portion. The first bending portion is arranged adjacent to the functional film layer. The second bending portion is connected to a side of the first bending portion away from the functional film layer, and includes a second edge away from the first bending portion. A distance between the second edge and the functional film layer in a first direction is largest in the protective layer, and the first direction is perpendicular to an interface between the display portion and the bending portion. An elastic modulus of the first bending portion is smaller than that of the second bending portion. The cover plate is located at one side of the functional film layer away from the array substrate.

In an exemplary embodiment of the present disclosure, a fabrication method of a display panel includes steps of:

- providing a flexible array substrate, wherein the array substrate has a flat plate structure and includes a display portion, a bonding portion and a bending portion connected between the display portion and the bonding portion;
- forming a functional film layer on the array substrate, wherein an orthographic projection of the functional film layer on the array substrate is in the display portion;
- forming a protective layer on the array substrate, wherein the protective layer and the functional film layer are located on the same side of the array substrate, and an orthographic projection of the protective layer on the array substrate is in the bending portion;
- wherein the protective layer includes a first bending portion at a side close to the functional film layer and a second bending portion at a side of the first bending portion away from the functional film layer, and a rigidity of the first bending portion is smaller than that of the second bending portion;
- bending the bending portion so that the bonding portion is at a side of the display portion away from a display side thereof.

In an exemplary embodiment of the present disclosure, a thickness of the first bending portion is smaller than that of the second bending portion.

In an exemplary embodiment of the present disclosure, the step of forming a protective layer on the array substrate includes:

- forming a protective layer material with uniform thickness on the array substrate for several times, wherein multiple layers of protective layer material are configured to form the protective layer;
- wherein the number of times of forming the protective layer material on the first bending portion is less than that of forming the protective layer material on the second bending portion.

In an exemplary embodiment of the present disclosure, the step of forming a protective layer on the array substrate includes:

- forming a colloidal protective layer material on the array substrate, the protective layer material being configured to form the protective layer;
- wherein the first bending portion is in a climbing area of the protective layer material.

In an exemplary embodiment of the present disclosure, an elastic modulus of the first bending portion is smaller than that of the second bending portion.

In an exemplary embodiment of the present disclosure, the step of forming a protective layer on the array substrate includes:

- forming a colloidal protective layer material on the array substrate;
- curing the protective layer material, wherein a curing degree of the first bending portion is smaller than that of the second bending portion.

In an exemplary embodiment of the present disclosure, the step of forming a protective layer on the array substrate includes:

- forming a colloidal protective layer material on the array substrate;
- curing the whole protective layer material; and
- softening the first bending portion.

It shall be understood that the above general description and the following detailed description are merely exemplary and explanatory and are not intended to be restrictive of the present disclosure.

BRIEF DESCRIPTION OF THE DRAWINGS

The accompanying drawings, which are incorporated in and constitute part of this specification, illustrate embodiments consistent with the invention and, together with the description, serve to explain the principles of the invention. Understandably, the drawings in the following description are only for illustrating some embodiments of the present disclosure and those of ordinary skill in the art can also derive other drawings based on the drawings without paying any creative labor.

DETAILED DESCRIPTION

Figure 1:
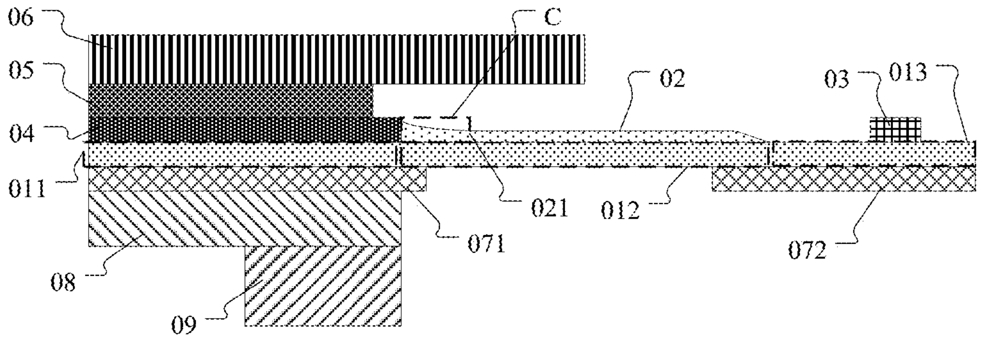
FIG. 1 is a schematic structural diagram of a semi-finished display panel in the related art.

Exemplary embodiments will now be described more fully with reference to the accompanying drawings. However, the exemplary embodiments may be embodied in a variety of forms and should not be construed as being limited to the embodiments set forth herein. On the contrary, the embodiments are provided to make the present disclosure comprehensive and through and to fully convey the concept of the exemplary embodiments to those skilled in the art. The same reference signs in the drawings denote the same or similar structures, and detailed descriptions thereof will be omitted.

Although terms having opposite meanings such as “up” and “down” are used herein to describe the relationship of one component relative to another component, such terms are used herein only for the sake of convenience, for example, “in the direction illustrated in the figure.” It can be understood that if a device denoted in the drawings is turned upside down, a component described as “above” something will become a component described as “under” something. Other relative terms, such as “high”, “low”, “top”, “bottom”, “left”, and “right” have similar meanings. When a structure is described as “above” another structure, it probably means that the structure is integrally formed on another structure, or, the structure is “directly” disposed on another structure, or, the structure is “indirectly” disposed on another structure through an additional structure.

Words such as “one”, “an/a”, “the” and “said” are used herein to indicate the presence of one or more elements/component parts/and others. Terms “including”, and “having” have an inclusive meaning which means that there may be additional elements/component parts/and others in addition to the listed elements/component parts/and others.

Figure 2:
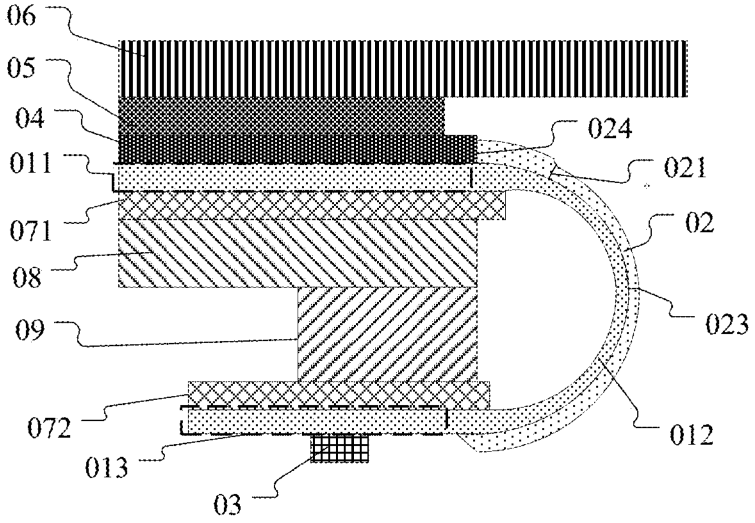
FIG. 2 is a schematic structural diagram of a finished display panel in the related art.

As shown in FIGS. 1 and 2, FIG. 1 is a schematic structural diagram of a semi-finished display panel in related art, and FIG. 2 is a schematic structural diagram of a finished display panel in the related art. In the related art, the display panel may include a flexible array substrate, a functional film layer 04, and a protective layer 02 (MCL, Metal Coating Layer). The flexible array substrate may include a display portion 011, a bending portion 012 and a bonding portion 013. The protective layer 02 may cover the bending portion 012, and the functional film layer 04 may be attached to the display portion 011. The bonding portion 013 may be configured to bond a chip 03. The display panel may also include a first bottom film 071, a second bottom film 072, a heat dissipation layer 08, an adhesive layer 09, a cover plate 06, and an adhesive layer 05 bonded between the cover plate 06 and the functional film layer 04. The functional film layer 04 may include at least one of a filter layer or a touch layer, for example, the functional film layer 04 may be a polarizer. The protective layer 02 may adjust a position of a neutral layer of the bending portion, so that the neutral layer is located at a position of a metal wiring layer of the bending portion, thus reducing the possibility of fracture of the metal wiring layer of the bending portion during being bent. The cover plate 06 may be made of polyimide (PI), glass, etc.

In the related art, a protective layer 02 is usually coated on the bending portion 012, and then a functional film layer 04 is attached to the display portion 011. In order to prevent the functional film layer 04 from being attached to the protective layer 02, and considering the coating tolerance of the protective layer 02 and the bonding tolerance of the functional film layer 04, it is necessary to reserve a certain gap between the functional film layer 04 and the protective layer 02 during the design, therefore the display panel will have a wider lower frame.

In the related art, as shown in FIG. 1, in order to reduce the frame of the display panel, the functional film layer 04 may be attached to the display portion 011 first and then, the protective layer 02 may be coated on the bending portion 012. However, due to a siphon effect of the functional film layer 04 on the colloid material used to form the protective layer 02, the protective layer 02 will be locally thickened in an area C near the functional film layer, and a thickness segment difference of the protective layer 02 will occur at an edge 021 of the area C away from the functional film layer. As shown in FIG. 2, after the protective layer 02 bends along with the bending portion 012, due to different bending stresses at different positions of the protective layer 02, the protective layer 02 will be thinner from its arc top edge 023 (the rightmost position of an arc formed by the protective layer) to both sides, so that the thickness segment difference of the protective layer at the edge 021 will further increase. Also, since the edge 021 is close to the more stable cover plate 06, in a reliability test of the display panel, the protective layer is apt to be folded along the edge 021 at the position of the edge 021, that is, the protective layer is apt to be bent at the edge 021 with a smaller bending angle. Therefore, a line breakage is likely to occur near the edge 021 of the protective layer. The protective layer may also include an edge 024 close to a side of the functional film layer 04. As shown in FIG. 2, a bonding area reliability test may include: pressing an edge 023 to the left by a pressing plate until the line breakage occurs on the display panel, and recording a moving distance of the pressing plate to the left when the line breakage occurs on the display panel. The moving distance of the pressing plate to the left when the line breakage occurs on the display panel can be defined as reliability value of the reliability test, and the greater the reliability value is, the higher the reliability of the display panel is.

Figure 3:
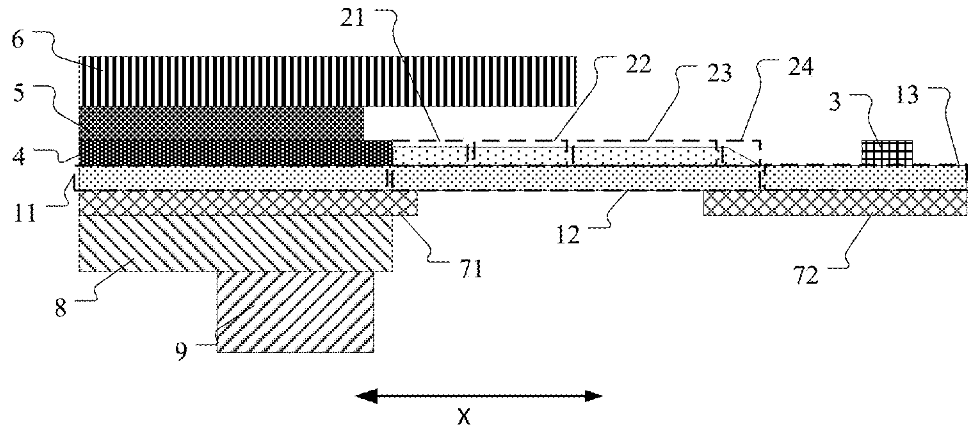
FIGS. 3 and 4 are process flow diagrams of an exemplary embodiment of a fabrication method of a display panel of the present disclosure.
Figure 4:
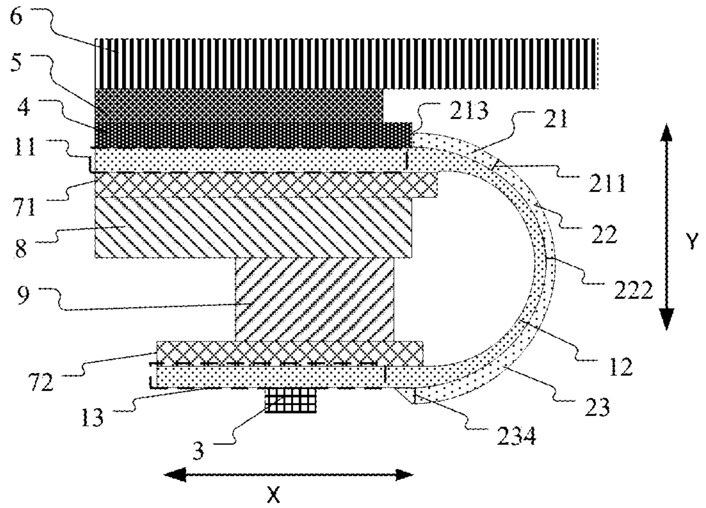

Based on this, an exemplary embodiment of the present disclosure provides a fabrication method of a display panel, as shown in FIGS. 3 and 4. FIGS. 3 and 4 are process flow diagrams of an exemplary embodiment of the fabrication method of the display panel of the present disclosure. The fabrication method may include:

as shown in FIG. 3, step S1, providing a flexible array substrate, wherein the array substrate may have a flat plate structure and includes a display portion 11, a bonding portion 13 and a bending portion 12 connected between the display portion 11 and the bonding portion 13;

step S2, forming a functional film layer 4 on the array substrate, wherein an orthographic projection of the functional film layer 4 on the array substrate is located in the display portion 11, wherein the functional film layer 4 may include one or more of a filter layer and a touch layer, for example, the functional film layer 4 may be a polarizer;

step S3, forming a protective layer on the array substrate, wherein the protective layer and the functional film layer 4 are located on the same side of the array substrate, and an orthographic projection of the protective layer on the array substrate is located at the bending portion 12; the orthographic projection of the protective layer on the array substrate may be overlapped (coincide) with the bending portion 12, that is, a part of the array substrate covered by the orthographic projection of the protective layer forms the bending portion 12, while a part of the array substrate not covered by the orthographic projection of the protective layer forms the display portion 11 and the bonding portion 13. The display portion 11 and the bonding portion 13 are connected to opposite sides of the bending portion 12, respectively.

The protective layer may include a first bending portion 21 at a side close to the functional film layer 4 and a second bending portion 22 at a side of the first bending portion 21 away from the functional film layer, and a rigidity of the first bending portion 21 is less than that of the second bending portion 22.

As shown in FIG. 4, the fabrication method may also include: step S4, bending the bending portion 12, so that the bonding portion 13 is located at a side of the display portion 11 away from its display side.

In this exemplary embodiment, the rigidity of the first bending portion 21 is less than that of the second bending portion 12. Compared with FIG. 2 in the related art, the present exemplary embodiment reduces the rigidity of the first bending portion 21. Therefore, in the reliability test, when the moving distance of the pressing plate] is the reliability value in FIG. 2, since the first bending portion 21 has higher bending performance, the first bending portion 21 will not be folded along the first edge 211 at a first edge 211 of the first bending portion 21 close to the second bending portion 22 under the bending action of the first bending portion 21 itself. Therefore, the reliability value of the display panel will increase accordingly. The first edge 211 can be understood as an interface between the first bending portion 21 and the second bending portion 22.

In this exemplary embodiment, as shown in FIG. 3, the first bending portion 21 and the second bending portion 22 may be distributed along the first direction X. The protective layer may be formed by coating a protective layer colloid material on the array substrate, and then curing the colloid material to form the protective layer. As shown in FIG. 3, when the protective layer colloid material is coated on the array substrate, since the protective layer colloid material has fluidity, the cured protective layer will have a climbing portion 24 at its edge position. In this exemplary embodiment, the second bending portion 22 may be connected between the first bending portion 21 and the climbing portion 24. As shown in FIG. 3, the protective layer may also include a third bending portion 23, and the third bending portion 23 may be connected between the second bending portion 22 and the climbing portion 24. As shown in FIG. 4, the first bending portion 21 may include a third edge 213 adjacent to the functional film layer 4, and the second bending portion 22 may include a second edge 222 at a side away from the first bending portion 21. The third bending portion 23 may include a fourth edge 234 away from the second bending portion 22. As shown in FIG. 4, after the protective layer is bent, the second edge 222 of the second bending portion 22 may be located at an arc top formed by the protective layer, that is, in the protective layer, a distance between the second edge 222 and the functional film layer 4 in the first direction x is the largest. The second edge 222 can be understood as an interface between the second bending portion 22 and the third bending portion 23, and the third edge 213 can be understood as an interface between the first bending portion 21 and the functional film layer 4.

In this exemplary embodiment, as shown in FIG. 3, a size of the first bending portion 21 in the first direction X may be equal to an arc distance between the edge 024 and the edge 021 in FIG. 2. That is, after the protective layer is bent, the first edge 211 of the first bending portion 21 may be located at the position where the protective layer should be folded. Since the rigidity of the first bending portion 21 is lower than that of the second bending portion 22 before the first bending portion 21 is bent, a rigidity difference of the protective layer on both sides of the first edge 211 is smaller than that of the protective layer on both sides of the edge 021 in FIG. 2 after the first bending portion 21 is bent, so that it is not apt to be folded at the first edge 211 in the reliability test, and the folded position will move towards the third edge 213. Since the third edge 213 is close to a side of the display portion 11 and a structure of the side of the display portion 11 is relatively stable, the display panel fabricated by the fabrication method of the display panel has higher reliability.

It should be understood that in other exemplary embodiments, the size of the first bending portion 21 in the first direction X may also be slightly larger than the arc distance between the edge 021 and the edge 024 of the protective layer in FIG. 2, or slightly smaller than the arc distance between the edge 021 and the edge 024 of the protective layer in FIG. 2, which are also within the protection scope of this disclosure.

In this exemplary embodiment, a method for obtaining the size of the first bending portion 21 in the first direction X may include: performing a reliability detection on a plurality of display panels, obtaining a position of each of the display panels where a wiring of the array substrate is broken (hereinafter referred to as "a wiring breakage position"), observing the protective layer near the wiring breakage position of the array substrate, obtaining a position where a thickness segment difference of the protective layer near the wiring breakage position is larger, measuring an arc length from the position of the protective layer where the thickness segment difference is larger to a side near the functional film layer, and calculating an average value of the arc length(s). The average value may be the size of the first bending portion 21 in the first direction X. The position of the array substrate where the wiring is broken can be obtained by a detection circuit. After the wiring breakage position of the array substrate is obtained, the bending portion 12 in the array substrate may be filled with a colloid and sliced (injecting an epoxy resin which is cured with a curing agent, and then polishing the cross-section of the bending portion), and then the cross-section of the bending portion 12 may be observed through a microscope to obtain the position of the protective layer near the wiring breakage position having the larger thickness segment difference. The number of display panels for reliability detection may be 16, 32, etc.

Figure 5:
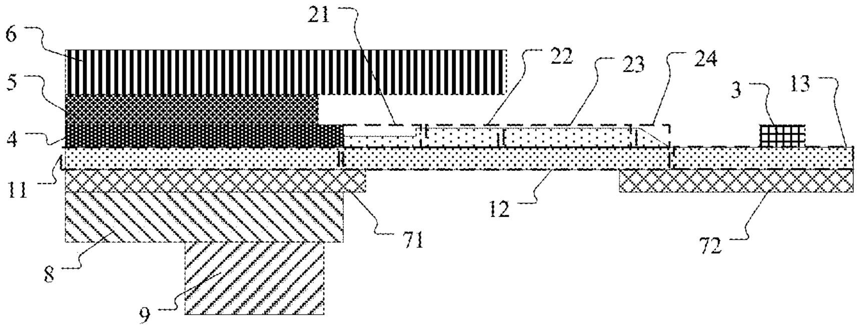
FIG. 5 is a process flow diagram of an exemplary embodiment of a fabrication method of a display panel of the present disclosure.
Figure 6:
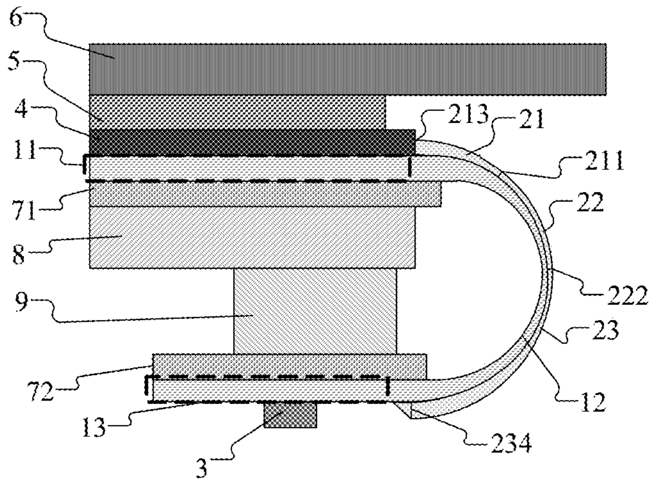
FIG. 6 is a process flow diagram of an exemplary embodiment of a fabrication method of a display panel of the present disclosure.

In this exemplary embodiment, FIGS. 5 and 6 are process flow diagrams of an exemplary embodiment of the fabrication method of the display panel of the present disclosure. A method for realizing that the rigidity of the first bending portion 21 is less than that of the second bending portion 22 is to enable the thickness of the first bending portion 21 to be less than that of the second bending portion 22. The thickness of the first bending portion 21 may be 70%-90% (for example, 70%, 80%, 90%, etc.) of the thickness of the second bending portion 22. Specifically, the thickness of the first bending portion 21 may be 105±30 μm, and the thickness of the second bending portion 22 may be 120±30 μm. FIG. 6 is a process flow diagram of an exemplary embodiment of the fabrication method of the display panel of the present disclosure. After the protective layer is bent, the thickness difference between the first bending portion 21 and the second bending portion 22 decreases compared with the thickness difference before being bent under the action of bending stress, and the thickness segment difference at the position of the first edge 211 decreases accordingly. Therefore, in the reliability test, the folding is not prone to occur at the first edge 211, and the folded position will move towards the third edge 213. Since the third edge 213 is close to a side of the display portion 11, and the structure on the side of the display portion 11 is more stable, the display panel fabricated by the fabrication method of the display panel has higher reliability. It should be noted that the thickness of the first bending portion 21 being smaller than that of the second bending portion 22 means that, an average thickness of the first bending portion 21 is smaller than that of the second bending portion 22, or a minimum thickness of the first bending portion 21 is smaller than that of the second bending portion 22. When forming the protective layer, the functional film layer 4 in FIG. 5 will also have a siphon effect on the protective layer colloid material for forming the first bending portion 21. The thickness of a side edge of the first bending portion 21 close to the functional film layer 4 may be greater than or equal to, or smaller than the thickness of the second bending portion 22. Accordingly, as shown in FIG. 6, after the protective layer is bent, the thickness at the third edge 213 may be greater than or equal to, or smaller than the thickness at the fourth edge 234.

In this exemplary embodiment, as shown in FIG. 6, after the protective layer is bent, the thickness of the first bending portion 21 may gradually decrease from the third edge 213 to the first edge 211 under the action of bending stress. The thickness of the second bending portion 22 may gradually decrease from a side near the first bending portion 21 to a side away from the first bending portion 21. The thickness of the third bending portion 23 may gradually increase from a side near the second bending portion 22 to a side away from the second bending portion 22.

In this exemplary embodiment, as shown in FIG. 6, after the protective layer is bent, a difference between a maximum thickness of the first bending portion and a minimum thickness of the second bending portion may be less than or equal to 0.05 mm, for example, the difference may be 0.01 mm, 0.02 mm, 0.03 mm, 0.04 mm or 0.05 mm. The maximum thickness of the first bending portion 21 may be the thickness of the first bending portion 21 at the third edge 213. The minimum thickness of the second bending portion may be the thickness of the second bending portion 22 at the second edge 222. The maximum thickness of the first bending portion may be greater than the minimum thickness of the second bending portion.

In this exemplary embodiment, as shown in FIG. 6, an arc length of the first bending portion may be greater than or equal to 0.188 mm and less than or equal to 0.235 mm, for example, 0.188 mm, 0.200 mm or 0.235 mm. The arc length of the second bending portion may be greater than or equal to 0.235 mm and less than or equal to 0.285 mm, for example, 0.235 mm, 0.255 mm or 0.285 mm.

The maximum thickness of the first bending portion may be greater than or equal to 0.13 mm and less than or equal to 0.15 mm. For example, the maximum thickness of the first bending portion may be 0.13 mm, 0.135 mm, 0.14 mm or 0.15 mm. The minimum thickness of the second bending portion may be greater than or equal to 0.08 mm and less than or equal to 0.1 mm. For example, the minimum thickness of the second bending portion may be 0.08 mm, 0.09 mm, or 0.1 mm. The protective layer may be a MCL colloid layer.

A distance from the bonding portion 13 to the display portion 11 may be 0.3-0.7 mm, for example, 0.3 mm, 0.4 mm, 0.5 mm, 0.6 mm or 0.7 mm. The distance from the bonding portion 13 to the display portion 11 can be understood as a distance from a side of the bonding portion 13 facing the display portion 11 to a side of the display portion 11 facing the bonding portion 13.

In this exemplary embodiment, a method for realizing that the thickness of the first bending portion is smaller than that of the second bending portion may be to form a protective layer material with uniform thickness on the array substrate for several times, and multiple layers of protective layer material may be configured to form the protective layer. The number of times of forming the protective layer material on the first bending portion 21 may be less than that of forming the protective layer material on the second bending portion 22. It should be understood that in other exemplary embodiments, the thickness of the first bending portion being smaller than that of the second bending portion can be realized in other ways, for example, forming the protective layer by using a coating process. When a coating component is displaced to a position where the first bending portion 21 is located, the thickness of the first bending portion 21 may be reduced by reducing a discharge amount of the coating component.

Figure 7:
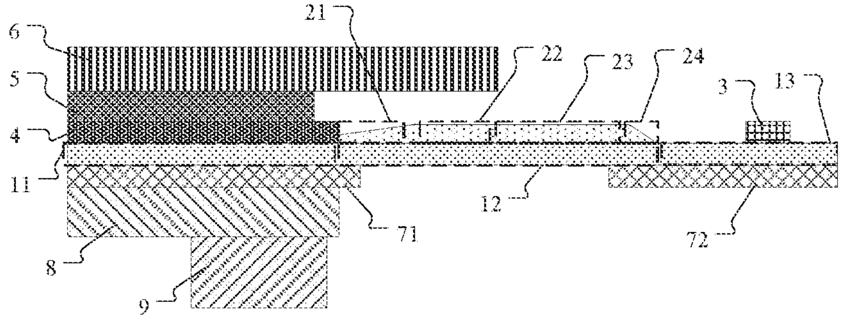
FIG. 7 is a process flow diagram of an exemplary embodiment of a fabrication method of a display panel of the present disclosure.

In an exemplary embodiment, a size of the protective layer climbing area in the first direction is generally about 400 μm. In the specific method for obtaining a size of the first bending portion 21 in the first direction X, the size of the first bending portion 21 in each display panel in the first direction is smaller than that of the climbing area in the first direction. In this exemplary embodiment, FIG. 7 is a process flow diagram of an exemplary embodiment of the fabrication method of the display panel of the present disclosure. The step of forming the protective layer on the array substrate may include forming a colloidal protective layer material on the array substrate, wherein the protective layer material is configured to form the protective layer. The first bending portion 21 may be located in the climbing area of the protective layer material. Specifically, when coating the protective layer material, the first bending portion 21 may be located in the climbing area of the protective layer material by controlling the coating position, while ensuring the protective layer material to flow to the functional film layer 4. In the production line equipment, there are two alignment modes for coating the protective layer material: alignment with MARK as a reference and alignment with the functional film layer as a reference. Since the protective layer material is required to flow to an edge of the functional film layer 4, alignment with the functional film layer as a reference may be used in this exemplary embodiment, that is, taking an attachment position of the functional film layer as a reference, and grasping the edge of the functional film layer for alignment to fit the coating material position.

It should be noted that when forming the protective layer, the functional film layer 4 in FIG. 7 will also have a siphon effect on the protective layer colloid material for forming the first bending portion 21. The thickness of a side edge of the first bending portion 21 near the functional film layer 4 may be greater than or equal to, or smaller than the thickness of the second bending portion 22. Accordingly, after the protective layer is bent, the thickness at the third edge 213 may be greater than or equal to, or smaller than the thickness at the fourth edge 234.

Figure 8:
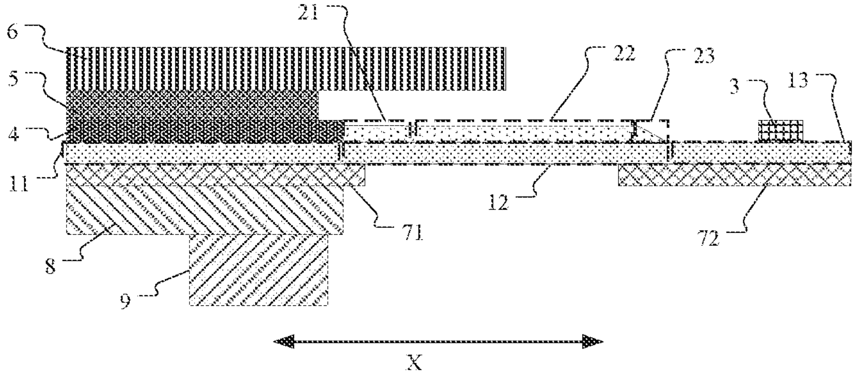
FIGS. 8 and 9 are process flow diagrams of another exemplary embodiment of a fabrication method of a display panel of the present disclosure.
Figure 9:
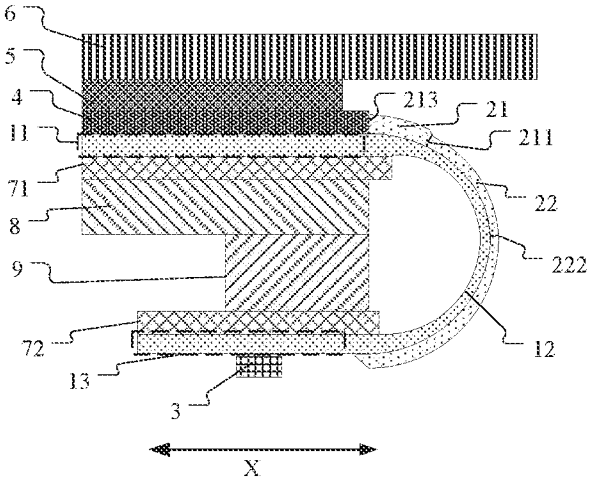

In this exemplary embodiment, the rigidity of the first bending portion being smaller than that of the second bending portion can be realized in other ways. As shown in FIGS. 8 and 9, FIGS. 8 and 9 are process flow diagrams of another exemplary embodiment of the fabrication method of the display panel of the present disclosure. A method for realizing that the rigidity of the first bending portion 21 is smaller than that of the second bending portion 22 may also be enable an elastic modulus of the first bending portion 21 to be smaller than that of the second bending portion 22. As shown in FIG. 9, after the protective layer is bent, there is still a large thickness segment difference at the first edge 211, however, since the elastic modulus of the first bending portion 21 is smaller than that of the second bending portion 22, it is not easy to be folded at the first edge 211 under the bending action of the first bending portion 21 itself in the reliability test. At the same time, the folded position will move towards the third edge 213. Since the third edge 213 is close to a side of the display portion 11, and the structure at the side of the display portion 11 is more stable, the display panel fabricated by the fabrication method of the display panel has higher reliability.

In this exemplary embodiment, a method for realizing that the elastic modulus of the first bending portion 21 is smaller than that of the second bending portion 22 may be to form a colloidal protective layer material on the array substrate; and curing the protective layer material, wherein a curing degree of the first bending portion 21 is less than that of the second bending portion 22. In this exemplary embodiment, the protective layer material may be a resin material, which may contain a photoinitiator or a photosensitizer. After the protective layer material is irradiated by absorbing ultraviolet (UV) light, active free radicals will be generated, thereby initiating polymerization, crosslinking and grafting reactions, and further transforming the resin from colloid to solid within a few seconds. In this exemplary embodiment, the method for curing the protective layer material may be performed by irradiating the protective layer material with an ultraviolet lamp. The curing degree of the protective layer material is positively correlated with power and irradiation time of the ultraviolet lamp. Therefore, by adjusting the power and/or irradiation time of the ultraviolet lamp, different curing degrees of the first bending portion 21 and the second bending portion 22 can be realized. For example, in this exemplary embodiment, the curing degree of the first bending portion 21 may be reduced by reducing the irradiation time of the ultraviolet or the irradiation power of the ultraviolet for the first bending portion 21 to reduce the elastic modulus of the first bending portion 21.

It should be understood that the elastic modulus of the first bending portion 21 being smaller than that of the second bending portion 22 can be realized in other ways. For example, after the first bending portion 21 and the second bending portion 22 are cured, a catalyst may be coated on the first bending portion 21, wherein the catalyst may destroy a molecular chain structure in the first bending portion 21, thereby realizing the softening effect of the first bending portion 21.

In this exemplary embodiment, as shown in FIGS. 3-9, before bending the bending portion, the fabrication method of the display panel may further include: forming the display portion 11 on the first bottom film 71 and forming the bonding portion 13 on the second bottom film 72; bonding a cover plate 6 at a side of the functional film layer 4 facing away from the array substrate through an adhesive layer 5; forming a heat dissipation layer 8 at a side of the first bottom film 71 facing away from the array substrate; forming an adhesive layer 9 at a side of the heat dissipation layer 8 away from the base substrate; forming a chip 3 on the bonding portion 13. The cover plate 6 may be made of polyimide (PI), glass, etc.

It should be understood that in other exemplary embodiments, it is also possible to adjust the rigidity of the first bending portion by simultaneously adjusting the thickness and the elastic modulus of the first bending portion.

Figure 10:
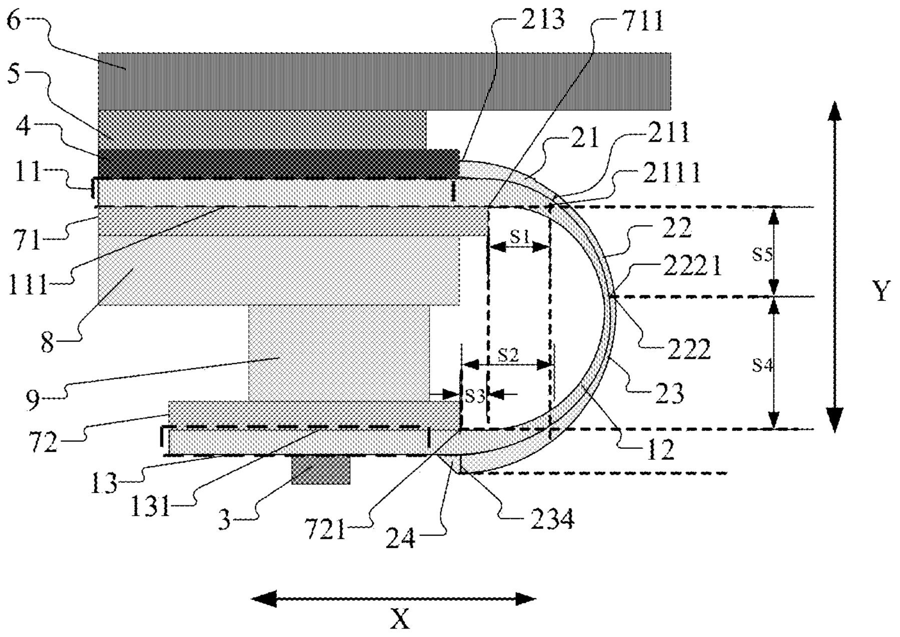
FIG. 10 is a schematic structural diagram of an exemplary embodiment of a display panel of the present disclosure.

The exemplary embodiment also provides a display panel, and FIG. 10 is a structural schematic diagram of an exemplary embodiment of the display panel of the present disclosure. The display panel may include an array substrate, a functional film layer 4 and a protective layer. The array substrate may include a display portion 11 and a bending portion 12. The bending portion 12 is connected to a side of the display portion 11. The functional film layer 4 is arranged at a side of the display portion 11. The protective layer covers the bending portion 12, and the protective layer and the functional film layer 4 are located at the same side of the array substrate. The protective layer may include a first bending portion 21 and a second bending portion 22. The first bending portion 21 is arranged adjacent to the functional film layer 4. The second bending portion 22 is connected to a side of the first bending portion 21 away from the functional film layer 4, and may include a second edge 222 away from the first bending portion. In the protective layer, a distance between the second edge 222 of the second bending portion 22 away from the first bending portion 21 and the functional film layer 4 in the first direction X is the largest. The first direction is perpendicular to an interface between the display portion and the bending portion, that is, the first direction is parallel to a plane where the display portion 11 is located. The array substrate may be a flexible array substrate, and the functional film layer 4 may include one or more of a filter layer and a touch layer, for example, the functional film layer 4 may be a polarizer. The display panel provided by this exemplary embodiment can be obtained by the fabrication method shown in FIG. 5, 6 or 7. Before the protective layer is bent, the thickness of the first bending portion is smaller than that of the second bending portion. Compared with the related art shown in FIG. 2, after the protective layer is bent, the maximum thickness of the first bending portion will be correspondingly reduced, while a maximum thickness of the second bending portion is substantially unchanged. A difference between the maximum thickness of the first bending portion and the minimum thickness of the second bending portion may be less than or equal to 0.05 mm, for example, the difference may be 0.01 mm, 0.02 mm, 0.03 mm, 0.04 mm, or 0.05 mm. The maximum thickness of the first bending portion 21 may be a thickness of the first bending portion 21 at the third edge 213. The minimum thickness of the second bending portion may be a thickness of the second bending portion 22 at the second edge 222. The maximum thickness of the first bending portion may be greater than the minimum thickness of the second bending portion.

It should be noted that the protective layer and the functional film layer 4 are located at the same side of the array substrate, which can be understood as being located at a side of the same surface of the array substrate. The functional film layer 4 is arranged at a side of the display portion 11, which can be understood that an orthographic projection of the functional film layer 4 on the array substrate is located on the display portion 11.

As shown in FIG. 10, the first bending portion 21 may include a first edge 211 connected with the second bending portion 22 and a third edge 213 adjacent to the functional film layer 4. Compared with the display panel in the related art as shown in FIG. 2, the protective layer has a smaller thickness segment difference at the first edge 211 of the first bending portion 21. In the reliability test, it is not easy to be folded at the first edge 211, and folded position will move towards the third edge 213. Since the third edge 213 is close to a side of the display portion 11, and the structure at the side of the display portion 11 is more stable, the display panel fabricated by the fabrication method of the display panel has higher reliability. The first edge 211 can be understood as an interface between the first bending portion 21 and the second bending portion 22, and the third edge can be understood as an interface between the first bending portion 21 and the functional film layer 4.

In this exemplary embodiment, the maximum thickness of the first bending portion may be greater than or equal to 0.12 mm and less than or equal to 0.135 mm, for example, 0.12 mm, 0.13 mm, or 0.135 mm. The maximum thickness of the second bending portion may be greater than or equal to 0.09 mm and less than or equal to 0.105 mm, for example, 0.09 mm, 0.1 mm, or 0.105 mm. The protective layer may be an MCL colloid layer.

In this exemplary embodiment, as shown in FIG. 10, the thickness of the first bending portion 21 may gradually decrease from its third edge 213 near the functional film layer to its first edge 211 away from the functional film layer. The thickness of the second bending portion 22 gradually decreases from an edge near the first bending portion 21 to an edge 222 away from the first bending portion 21.

In this exemplary embodiment, as shown in FIG. 10, the protective layer may further include a third bending portion 23 and a climbing portion 24. The third bending portion 23 may be connected to a side of the second bending portion 22 away from the first bending portion 21, and the climbing portion 24 may be connected to a side of the third bending portion 23 away from the second bending portion 22. The third bending portion 23 may include a fourth edge 234 away from the second bending portion 22, and a thickness of the third bending portion 23 may gradually increase from an edge close to the second bending portion 22 to the fourth edge 234. The thickness at the third edge 213 may be greater than or equal to, or smaller than the thickness at the fourth edge 234. The second edge 222 can be understood as an interface between the second bending portion 22 and the third bending portion 23. The fourth edge 234 is understood as an interface between the third bending portion 23 and the climbing portion 24.

In this exemplary embodiment, as shown in FIG. 10, the array substrate may further include a bonding portion 13, and the bonding portion 13 may be parallel to the display portion 11. The bending portion 12 is connected between the display portion 11 and the bonding portion 13. The display panel may also include a chip 3, a first bottom film 71 and a second bottom film 72. The chip 3 may be bonded to the bonding portion 13, and the chip 3 and the functional film layer 4 may be located at the same side of the array substrate. The first bottom film 71 may be located at a side of the display portion facing away from the functional film layer 4. The second bottom film 72 may be located at a side of the bonding portion 13 facing away from the chip 3. In the first direction X, the first edge 211 may be located between the first bottom film 71 and the second edge 222, and the first edge 211 may be located between the second bottom film 72 and the second edge 222. A distance S1 between the first edge 211 and the first bottom film 71 in the first direction X is less than or equal to a distance S2 between the first edge 211 and the second bottom film 72 in the first direction X. In this arrangement, a distance S4 between the second edge 222 and the bonding portion 13 in the second direction Y is greater than a distance S5 between the second edge 222 and the display portion 11 in the second direction Y after the protective layer is bent, wherein the second direction Y may be perpendicular to a plane where the display portion 11 is located. That is, the second edge 222 is located at a side of the midpoint between the third edge 213 and the fourth edge 234 that is offset to the third edge 213, so that there may be a larger bending radius at the first edge 211, that is, it is not easy to be folded at the first edge 211 in the reliability test.

It should be noted that, FIG. 10 is a cross-sectional view of the display panel on any cross-sectional surface, which is perpendicular to a bending axis of the bending portion 12. In this cross-sectional view, the first edge 211 may include a position point 2111 in contact with the bending portion 12, and the second edge 222 includes a position point 2221 in contact with the bending portion 12. An edge of the first bottom film 71 facing the first edge 211 includes a position point 711 that is in contact with the flexible array substrate, and an edge of the second bottom film 72 facing the first edge 211 includes a position point 721 that is in contact with the flexible array substrate. The bonding portion 13 includes a side surface 131 at a side facing the second bottom film 72, and the display portion 11 includes a side surface 111 at a side facing the first bottom film 71. The distance between the first edge 211 and the first bottom film 71 in the first direction X can be understood as a distance between the position point 2111 and a first plane where the position point 711 is located, wherein the first plane is perpendicular to the first direction. The distance between the first edge 211 and the second bottom film 72 in the first direction X can be understood as a distance between the position point 2111 and a second plane where the position point 721 is located, wherein the second plane is perpendicular to the first direction X. The distance between the second edge 222 and the bonding portion 13 in the second direction Y can be understood as a distance between the position point 2221 and a plane where the side surface 131 is located. The distance between the second edge 222 and the display portion 11 in the second direction Y can be understood as a distance between the position point 2221 and a plane where the side surface 111 is located.

In this exemplary embodiment, as shown in FIG. 10, a distance S3 between the edge of the first bottom film 71 facing the first edge 211 and the edge of the second bottom film 72 facing the first edge 211 in the first direction may be greater than or equal to 0 mm and less than or equal to 0.2 mm, for example, 0 mm, 0.1 mm or 0.2 mm. The distance between the first edge 211 and the first bottom film 71 in the first direction may be greater than or equal to 0.125 mm and less than or equal to 0.225 mm, for example, 0.125 mm, 0.155 mm, or 0.225 mm. The distance between the first edge 211 and the second bottom film 72 in the first direction may be greater than or equal to 0.125 mm and less than or equal to 0.425 mm, for example, 0.125 mm, 0.225 mm, 0.325 mm, or 0.425 mm.

It should be noted that the distance between the edge of the first bottom film 71 facing the first edge 211 and the edge of the second bottom film 72 facing the first edge 211 in the first direction can be understood as a distance between the first plane where the position point 711 is located and the second plane where the position point 721 is located, wherein both the first plane and the second plane are perpendicular to the first direction.

In this exemplary embodiment, as shown in FIG. 10, the arc length of the first bending portion 21 may be greater than or equal to 0.188 mm and less than or equal to 0.235 mm, for example, 0.188 mm, 0.215 mm, or 0.235 mm. The arc length of the second bending portion 22 may be greater than or equal to 0.235 mm and less than or equal to 0.285 mm, for example, 0.235 mm, 0.255 mm, or 0.285 mm.

In this exemplary embodiment, the distance between the bonding portion 13 and the display portion 11 may be 0.3-0.7 mm, for example, 0.3 mm, 0.4 mm, 0.5 mm, 0.6 mm, or 0.7 mm. The distance between the bonding portion 13 and the display portion 11 can be understood as a distance from a side surface of the bonding portion 13 facing the display portion 11 to a side surface of the display portion 11 facing the bonding portion 13. The reliability value of the display panel may be up to 215 μm-225 μm in the reliability test.

In this exemplary embodiment, as shown in FIG. 10, the display panel further includes a heat dissipation layer 8 and an adhesive layer 9. The heat dissipation layer 8 may be located at a side of the first bottom film 71 away from the display portion 11, and the adhesive layer 9 may be located between the second bottom film 72 and the heat dissipation layer 8. The heat dissipation layer 8 may have certain elasticity and may be configured to improve the seismic performance of the display panel. The heat dissipation layer 8 may be made of ultra-clean foam. The heat dissipation layer 8 may also adjust the distance between the bonding portion 13 and the display portion 11 by its own thickness, so as to adjust the bending radius of the bending portion 12. The adhesive layer 9 may be configured to fix the heat dissipation layer 8 and the second bottom film 72.

In this exemplary embodiment, as shown in FIG. 10, the adhesive layer 9 is required to be completely attached to the heat dissipation layer 8, so as to achieve a better supporting effect and provide the reliability of the display panel. However, there is an attachment tolerance when the adhesive layer 9 is attached to the heat dissipation layer 8. Therefore, during the design, it is necessary to retract the adhesive layer 9 to the left relative to the heat dissipation layer 8, that is, a distance between the heat dissipation layer 8 and the first edge 211 in the first direction X is smaller than a distance between the adhesive layer 9 and the first edge 211 in the first direction X. This design makes it possible for the adhesive layer 9 to be completely attached to the heat dissipation layer 8 when there is an attachment tolerance.

Figure 11:
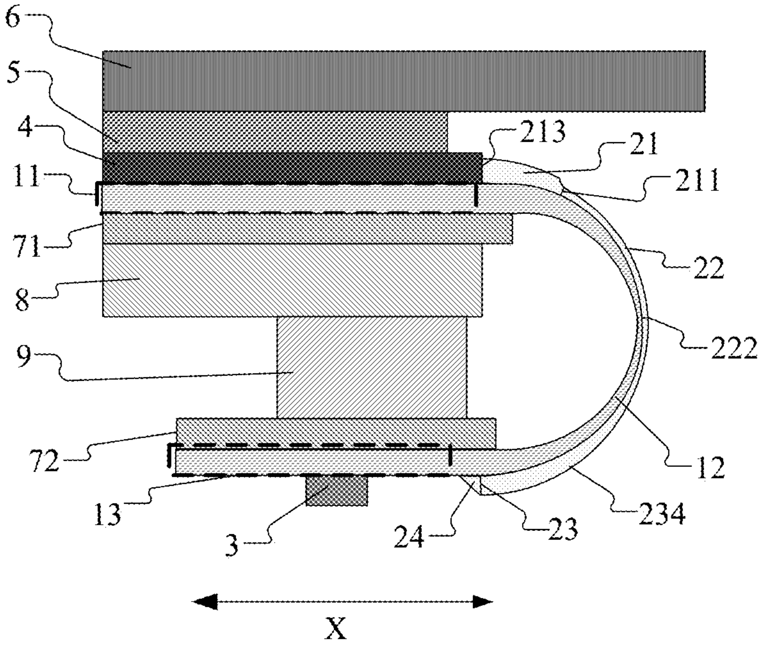
FIG. 11 is a schematic structural diagram of another exemplary embodiment of a display panel of the present disclosure.

This exemplary embodiment also provides a display panel, and FIG. 11 is a structural schematic diagram of another exemplary embodiment of the display panel of the present disclosure. The display panel may be fabricated by the fabrication method of the display panel shown in FIGS. 8 and 9. The display panel may include an array substrate, a functional film layer 4, and a protective layer. The array substrate may include a display portion 11 and a bending portion 12 connected to a side of the display portion 11. The functional film layer 4 is arranged at a side of the display portion 11. The protective layer covers the bending portion, and the protective layer and the functional film layer 4 are located at the same side of the array substrate. The protective layer includes a first bending portion 21 and a second bending portion 22, and the first bending portion 21 is adjacent to the functional film layer 4. The second bending portion 22 is connected to a side of the first bending portion 21 away from the functional film layer 4, and the edge of the second bending portion 22 away from the first bending portion 21 is located at an arc top formed by the protective layer, that is, in the protective layer, the distance between the second edge 222 of the second bending portion 22 away from the first bending portion 21 and the functional film layer 4 in the first direction X is the largest, wherein the first direction is perpendicular to the interface between the display portion and the bending portion, that is, the first direction is parallel to the plane where the display portion 11 is located. The elastic modulus of the first bending portion 21 may be smaller than that of the second bending portion 22. The first bending portion 21 includes a first edge 211 adjacent to the second bending portion 22 and a third edge 213 adjacent to the functional film layer.

In this exemplary embodiment, as shown in FIG. 11, the protective layer may further include a third bending portion 23 and a climbing portion 24. The third bending portion 23 may be connected to a side of the second bending portion 22 away from the first bending portion 21, and the climbing portion 24 may be connected to a side of the third bending portion 23 away from the second bending portion 22. The third bending portion 23 may include a fourth edge 234 away from the second bending portion 22, and a thickness of the third bending portion 23 may gradually increase from an edge close to the second bending portion 22 to the fourth edge 234. When the protective layer is formed, the functional film layer 4 has a siphon effect on the colloid material used to form the protective layer, and the thickness at the third edge 213 is larger than that at the fourth edge 234 before the protective layer is bent, and accordingly, the thickness at the third edge 213 will be larger than that at the fourth edge 234 after the protective layer is bent. The second edge 222 can be understood as an interface between the second bending portion 22 and the third bending portion 23. The fourth edge 234 is understood as an interface between the third bending portion 23 and the climbing portion 24. The first edge 211 can be understood as an interface between the first bending portion 21 and the second bending portion 22, and the third edge can be understood as an interface between the first bending portion 21 and the functional film layer 4.

In this exemplary embodiment, as shown in FIG. 11, since the elastic modulus of the first bending portion 21 is smaller than that of the second bending portion 22, it is not easily folded at the first edge 211 under the bending action of the first bending portion 21 itself in the reliability test. At the same time, the folded position will move towards the third edge 213. Since the third edge 213 is close to a side of the display portion 11, and the structure at the side of the display portion 11 is more stable, the display panel fabricated by the fabrication method of the display panel has higher reliability.

As shown in FIG. 11, the display panel may also include a first bottom film 71, a second bottom film 72, a cover plate 6, an adhesive layer 5, a heat dissipation layer 8, an adhesive layer 9, and a chip 3. The first bottom film 71, the second bottom film 72, the cover plate 6, the adhesive layer 5, the heat dissipation layer 8, the adhesive layer 9, and the chip 3 may have the same structure and positional relationship as the display panel in FIG. 10.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A fabrication method of a display panel, comprising:

providing a flexible array substrate, wherein the array substrate has a flat plate structure and comprises a display portion, a bonding portion, and a bending portion connected between the display portion and the bonding portion;

forming a functional film layer on the array substrate, wherein an orthographic projection of the functional film layer on the array substrate is in the display portion, and the functional film layer comprises a touch control layer;

forming a protective layer on the array substrate, wherein the protective layer and the functional film layer are located on the same side of the array substrate, and an orthographic projection of the protective layer on the array substrate is in the bending portion, wherein the protective layer comprises a first bending portion adjacent to and in contact with the touch control layer of the functional film layer at a third position, and a second bending portion at a side of the first bending portion away from the functional film layer, the second bending portion comprising a second position away from the first bending portion; and bending the bending portion so that the bonding portion is at a side of the display portion away from a display side thereof, wherein, before the bending portion is bent, an average thickness of the first bending portion in a second direction is smaller than an average thickness of the second bending portion in the second direction, and at the first position, a thickness of the first bending portion in the second direction is smaller than a thickness of the second bending portion in the second direction, and wherein the second direction is perpendicular to a plane where the display portion is located.

2. The fabrication method of the display panel according to claim 1, wherein forming the protective layer on the array substrate comprises:

applying a first number of coats of a protective layer material on the array substrate to form the first bending portion; and applying a second number of coats of the protective layer material on the array substrate to form the second bending portion, wherein the first number is less than the second number.

3. The fabrication method of the display panel according to claim 1, wherein an elastic modulus of the first bending portion is smaller than that of the second bending portion.

4. The fabrication method of the display panel according to claim 3, wherein forming the protective layer on the array substrate comprises:

forming a colloidal protective layer material on the array substrate; and curing the protective layer material, wherein a curing degree of the first bending portion is smaller than that of the second bending portion.

* * * * *